US012366882B2

(12) United States Patent
Faisal et al.

(10) Patent No.: US 12,366,882 B2
(45) Date of Patent: Jul. 22, 2025

(54) FIELD PROGRAMMABLE PLATFORM ARRAY (71) Applicant: Movellus Circuits Incorporated, Ann Arbor, MI (US)

(72) Inventors: Mohammad Faisal, San Francisco, CA (US); Jeffrey Alan Fredenburg, Chicago (IL)

(73) Assignee: Movellus Circuits Inc., Ann Arbor, MI (US)

( * ) Notice: Subject to any disclaimer, the term of this patent is extended or adjusted under 35 U.S.C. 154(b) by 144 days.

(21) Appl. No.: 17/552,336

(22) Filed: Dec. 15, 2021

(65) Prior Publication Data

US 2022/0200611 A1 Jun. 23, 2022

Related U.S. Application Data (60) Provisional application No. 63/149,766, filed on Feb. 16, 2021, provisional application No. 63/127,034, (Continued)

(51) Int. Cl.
G06F 1/10 (2006.01)
H01L 25/065 (2023.01)
(Continued)

(52) U.S. Cl.
CPC .......... G06F 1/10 (2013.01); H01L 25/0657 (2013.01); H03L 7/00 (2013.01); H03L 7/0816 (2013.01);
(Continued)

(58) Field of Classification Search
CPC ...... H01L 25/0657; H01L 2924/18161; H10B 80/00; H03L 7/00; H03L 7/0816;
(Continued)

(56) References Cited

U.S. PATENT DOCUMENTS

2017/0269630 A1* 9/2017 Kamezawa ............... G06F 1/10
2018/0034468 A1* 2/2018 Faisal ................... H03L 7/0998

FOREIGN PATENT DOCUMENTS

JP 201115533 * 5/2011
WO WO-2011155333 A1 * 12/2011 ............... G06F 1/10

* cited by examiner

Primary Examiner — Timor Karimy
(74) Attorney, Agent, or Firm — Lance Kreisman; Peninsula Patent Group (57) ABSTRACT An integrated circuit (IC) chip including clock generation circuitry to generate a clock signal. Clock interface circuitry is coupled to the clock generation circuitry and includes multiple transmit pins that are distributed across a mounting surface of the IC chip. Each of the multiple transmit pins is configured to transmit a respective version of the clock signal to one or more off-chip devices. Multiple receiver pins are distributed across the mounting surface of the IC chip and correspond to the multiple transmit pins. Each of the multiple receiver pins is configured to receive respective arrival clock signals from the one or more off-chip devices. Delay compensation circuitry is coupled to the clock interface circuitry and includes multiple delay circuits. Each delay circuit is configured to delay a given clock signal fed to a given transmit pin by a given delay value to establish global timing alignment of the arrival clock signals at the one or more external devices.

12 Claims, 7 Drawing Sheets

Related U.S. Application Data filed on Dec. 17, 2020, provisional application No. 63/127,040, filed on Dec. 17, 2020, provisional application No. 63/126,896, filed on Dec. 17, 2020.

(51) Int. Cl.
| | |
|---|---|
| *H03L 7/00* | (2006.01) |
| *H03L 7/081* | (2006.01) |
| *H03L 7/083* | (2006.01) |
| *H03L 7/099* | (2006.01) |

(52) U.S. Cl.
CPC ............ *H03L 7/0818* (2013.01); *H03L 7/083* (2013.01); *H03L 7/0991* (2013.01); *H01L 2924/18161* (2013.01)

(58) Field of Classification Search
CPC ..... H03L 7/0818; H03L 7/083; H03L 7/0991; G06F 1/10
See application file for complete search history.

FIELD PROGRAMMABLE PLATFORM ARRAY

CROSS-REFERENCE TO RELATED APPLICATIONS

This application is a Non-Provisional that claims priority to U.S. Provisional Application No. 63/126,896 filed Dec. 17, 2020, entitled FIELD PROGRAMMABLE CLOCK ARRAY, U.S. Provisional Application No. 63/149,766, filed Feb. 16, 2021, entitled FIELD PROGRAMMABLE CLOCK ARRAY, U.S. Provisional Application No. 63/127,034 filed Dec. 17, 2020, entitled LARGE-SCALE SYNCHRONOUS SYSTEMS, and U.S. Provisional Application No. 63/127,040, filed Dec. 17, 2020, entitled POST-SILICON CLOCK DISTRIBUTION MEASUREMENT CIRCUITRY, all of which are incorporated herein by reference in their entirety.

TECHNICAL FIELD

The disclosure herein relates to digital systems, subsystems, integrated circuits, and associated methods.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Digital systems, subsystems, integrated circuits, and associated methods are disclosed. In one embodiment, an integrated circuit (IC) chip is disclosed. The IC chip includes clock generation circuitry to generate a clock signal. Clock interface circuitry is coupled to the clock generation circuitry and includes multiple transmit pins that are distributed across a mounting surface of the IC chip. Each of the multiple transmit pins is configured to transmit a respective version of the clock signal to one or more off-chip devices. Multiple receiver pins are distributed across the mounting surface of the IC chip and correspond to the multiple transmit pins. Each of the multiple receiver pins is configured to receive respective arrival clock signals from the one or more off-chip devices. Delay compensation circuitry is coupled to the clock interface circuitry and includes multiple delay circuits. Each delay circuit is configured to delay a given clock signal fed to a given transmit pin by a given delay value to establish global timing alignment of the arrival clock signals at the one or more external devices. By employing the IC chip to establish global timing alignment of arrival clock signals as received by the external devices, significant complexities associated with conventional clock-domain-crossing circuitry may be avoided while providing an efficient and low-power way to distribute clock signals and power to IC devices.

Figure 1:
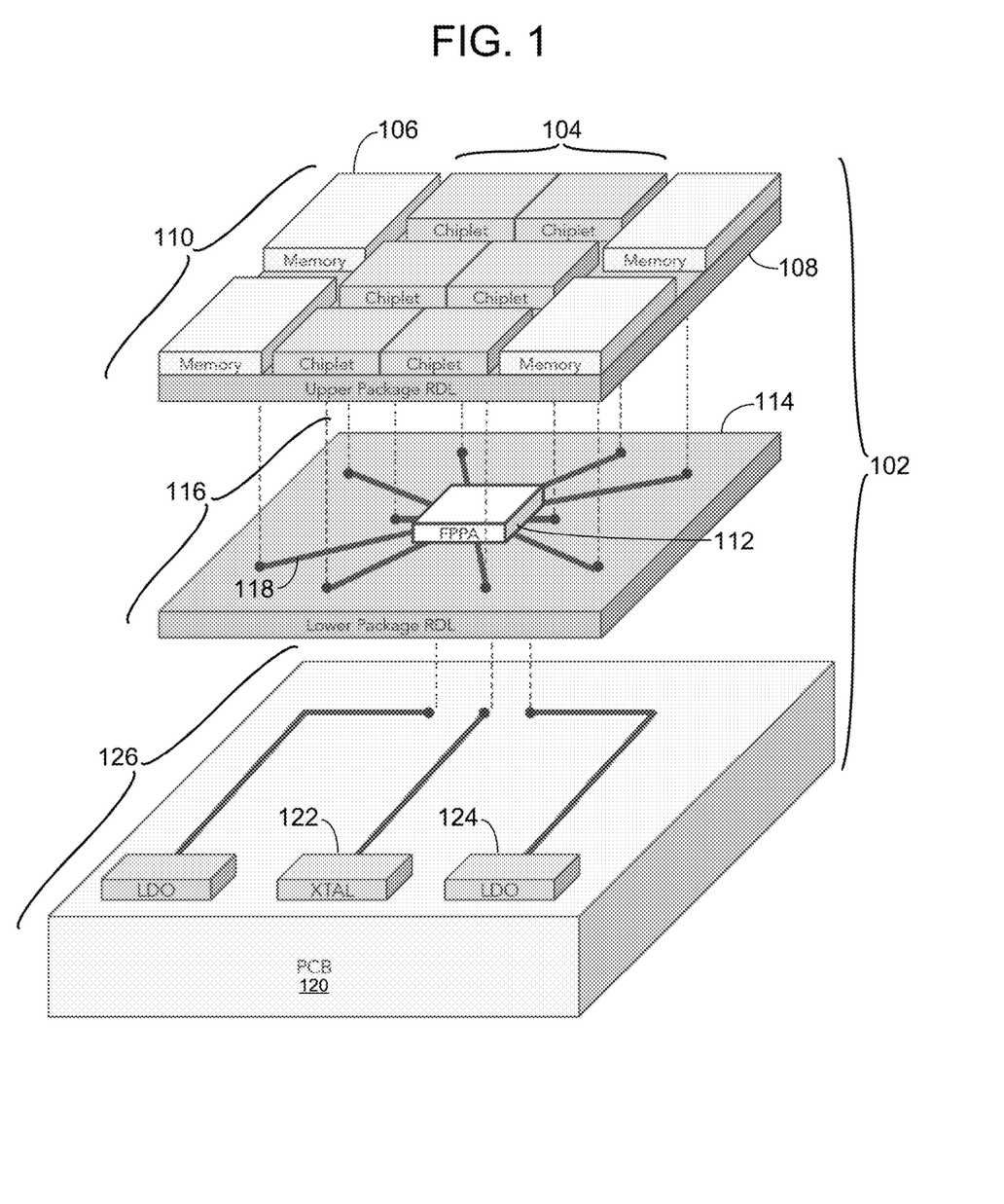
FIG. 1 illustrates an exploded view of one embodiment of a digital system that employs a plurality of chiplets and a field programmable platform array (FPPA) chip to deliver clock signals and power to the chiplets.

With reference to FIG. 1, an embodiment of a digital system is illustrated, generally designated 102. The digital system 102 includes an array of logic device chiplets 104. In some embodiments, the logic device chiplets may interface with an array of memory device chips, such as at 106. Each logic device chiplet may function as a separate and independent subsystem of the digital system 102, while maintaining a synchronous relationship with the other chiplets and memory devices. For one embodiment, the array of chiplets 104 and the array of memory device chips 106 are disposed on an upper package redistribution layer (RDL) 108 that together form an upper package assembly 110. The upper package RDL 108 includes routing paths to interconnect the chiplets and memory devices.

Further referring to FIG. 1, to provide a straightforward and power-efficient way to synchronize the chiplets 104 with one another and to the memory devices 106, the digital system 102 employs a field programmable platform array (FPPA) 112 to distribute clock signals and power to the array of chiplets 104 and memory devices 106. For one embodiment, more fully described with reference to FIGS. 2 and 3, the FPPA 112 is realized as an integrated circuit (IC) chip disposed on a lower package RDL 114 to form a lower package assembly 116 for packaging with the upper package assembly 110. Separate clock links routed through the lower package RDL 114, such as at 118, cooperate with corresponding routing contacts and metal paths formed in the upper package RDL 108 to couple each logic chiplet and memory chip to the FPPA 112. As more fully described below, separate power delivery paths may be similarly formed in the lower and upper RDLs 108 and 114 to distribute power in the form of regulated voltages to the array of logic device chiplets 104 and memory device chips 106.

With continued reference to FIG. 1, for one embodiment, a package substrate 120 provides a base package surface for the digital system 102. In some embodiments, a crystal clock source 122 and power sources, such as one or more low-dropout (LDO) voltage regulators, at 124, are mounted on the substrate 120 to form a substrate assembly 126 and provide a global clock source and power source to the FPPA 112. Taken together, the upper package assembly 110, the lower package assembly 116, and the substrate assembly 126 cooperate to form a single packaged device for the digital system 102 that is formed during a packaging procedure as part of a semiconductor manufacturing process.

Figure 4:
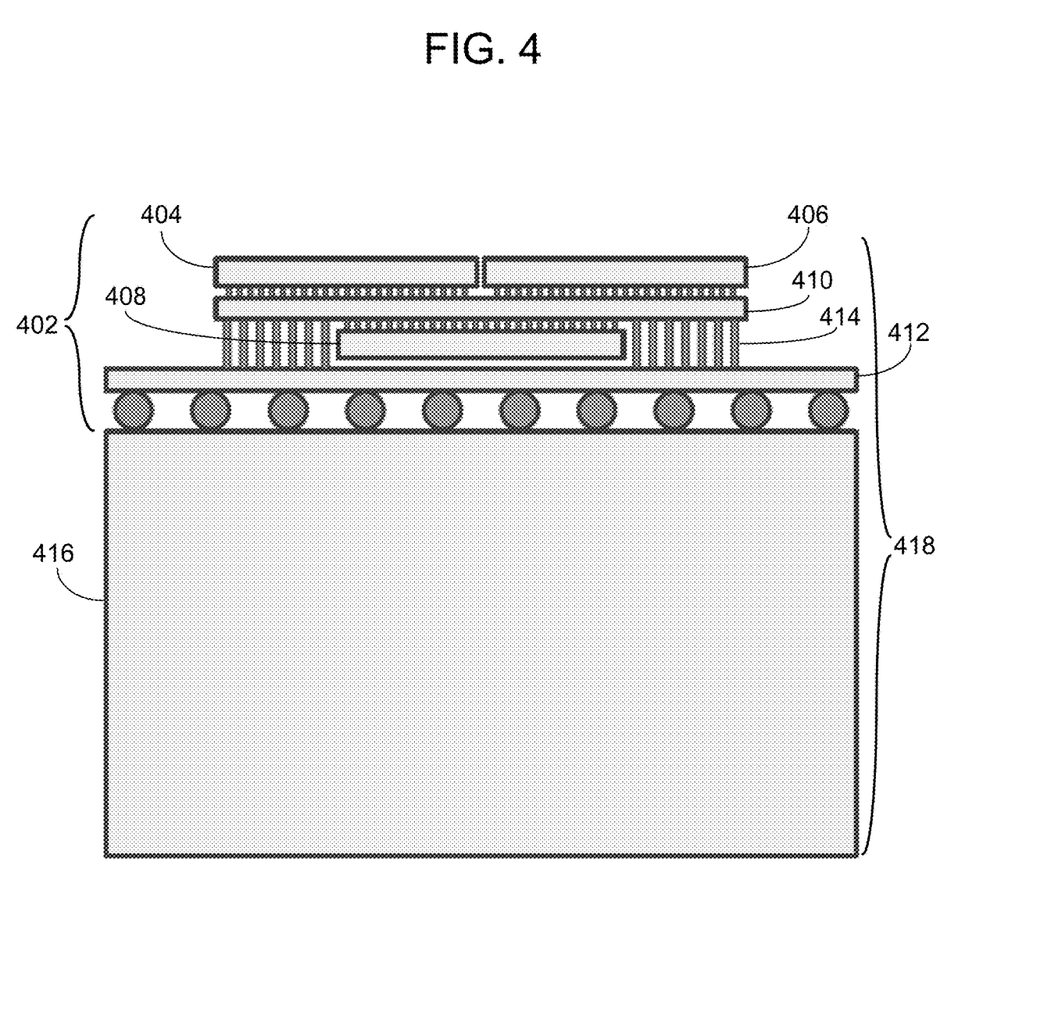
FIG. 4 illustrates one embodiment of a package-on-package semiconductor device that employs the FPPA of FIG. 1.
Figure 5:
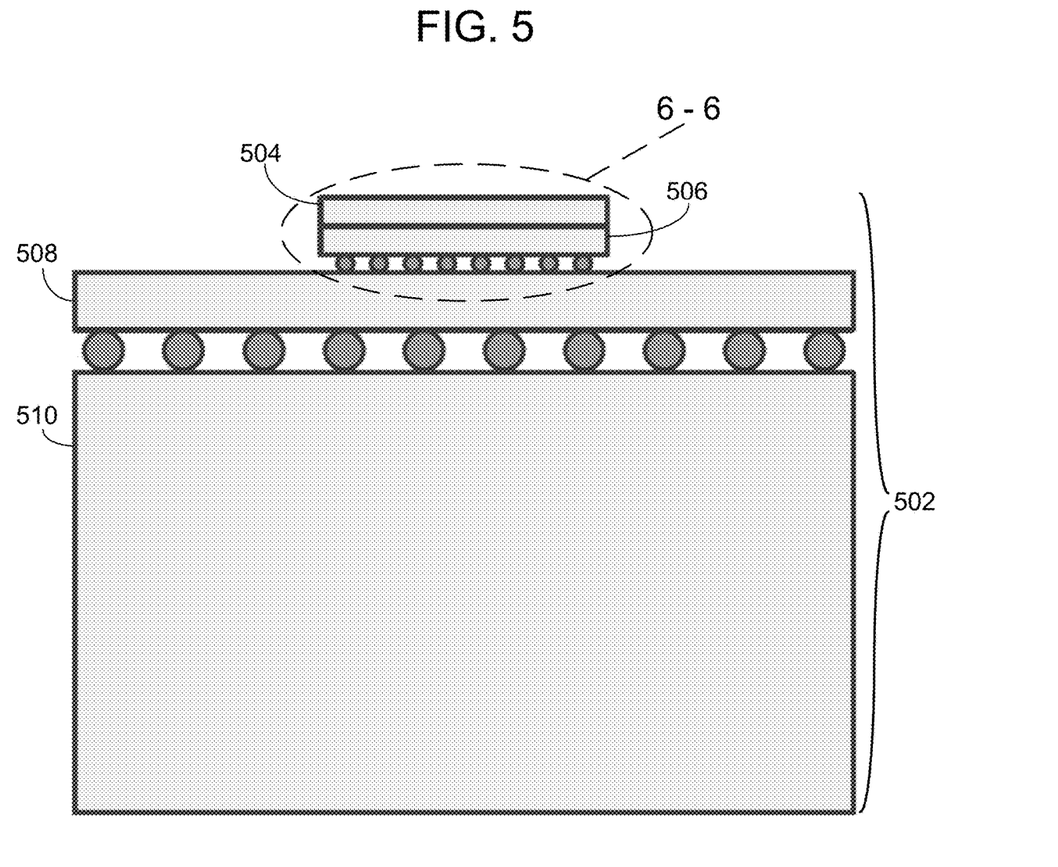
FIG. 5 illustrates a further embodiment of a packaged 3D semiconductor device that employs the FPPA of FIG. 1.
Figure 6:
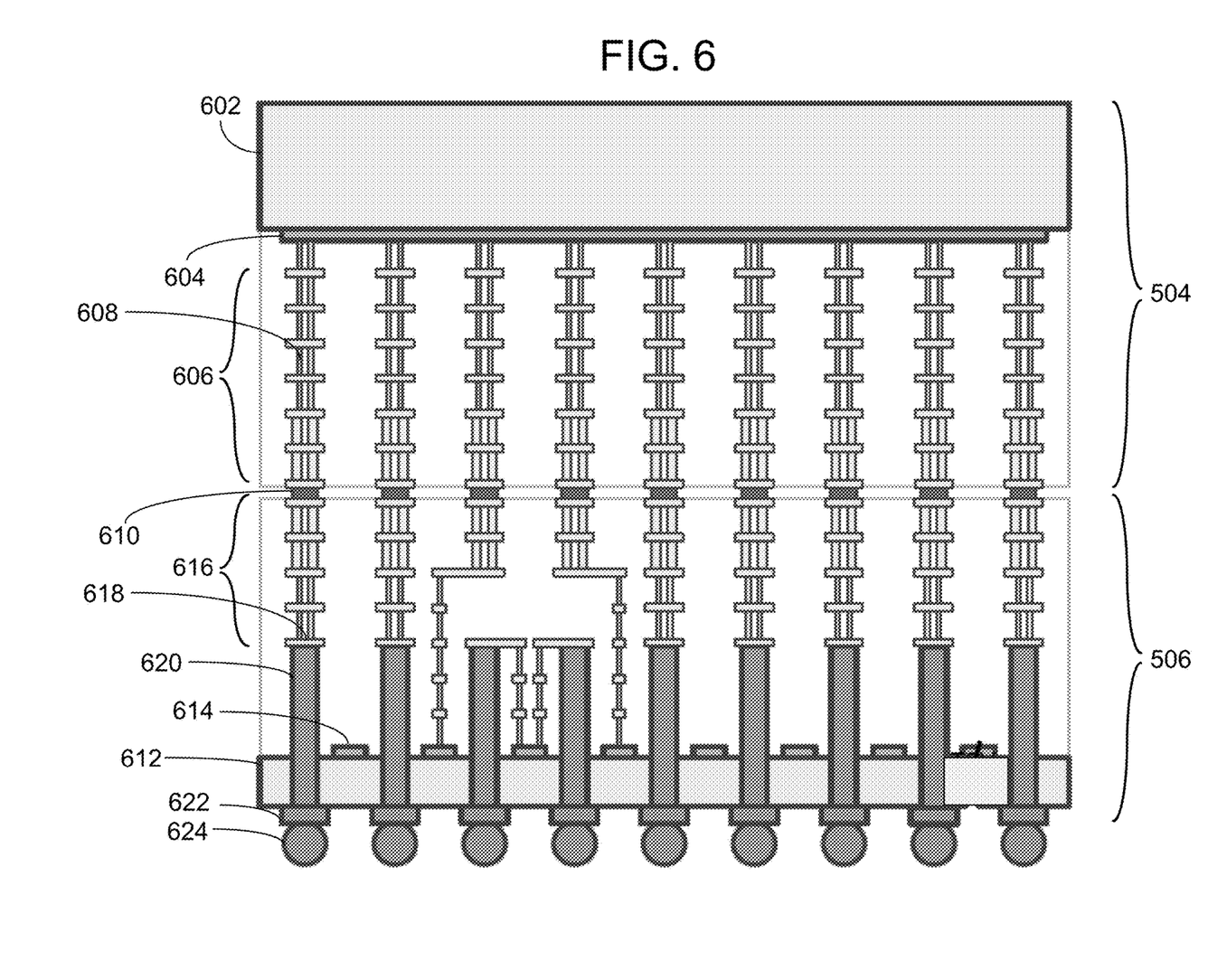
FIG. 6 illustrates a cross-sectional view of one embodiment of the logic die and FPPA of FIG. 5 stacked together as a packaged semiconductor device.

In operation, the FPPA 112, embedded in the package 102 proximate the chiplets 104 and memory devices 106, provides clean and power-efficient clock signals and regulated power to the chiplets and memory devices. Programmable logic associated with the FPPA 112 enables for user-friendly configurability for various settings, such as clock delay granularity adjustments and voltage regulation thresholds. Various alternative embodiments of the digital system 102 realized as a single packaged device are illustrated in FIGS. 4-6, and more fully described below.

Figure 2:
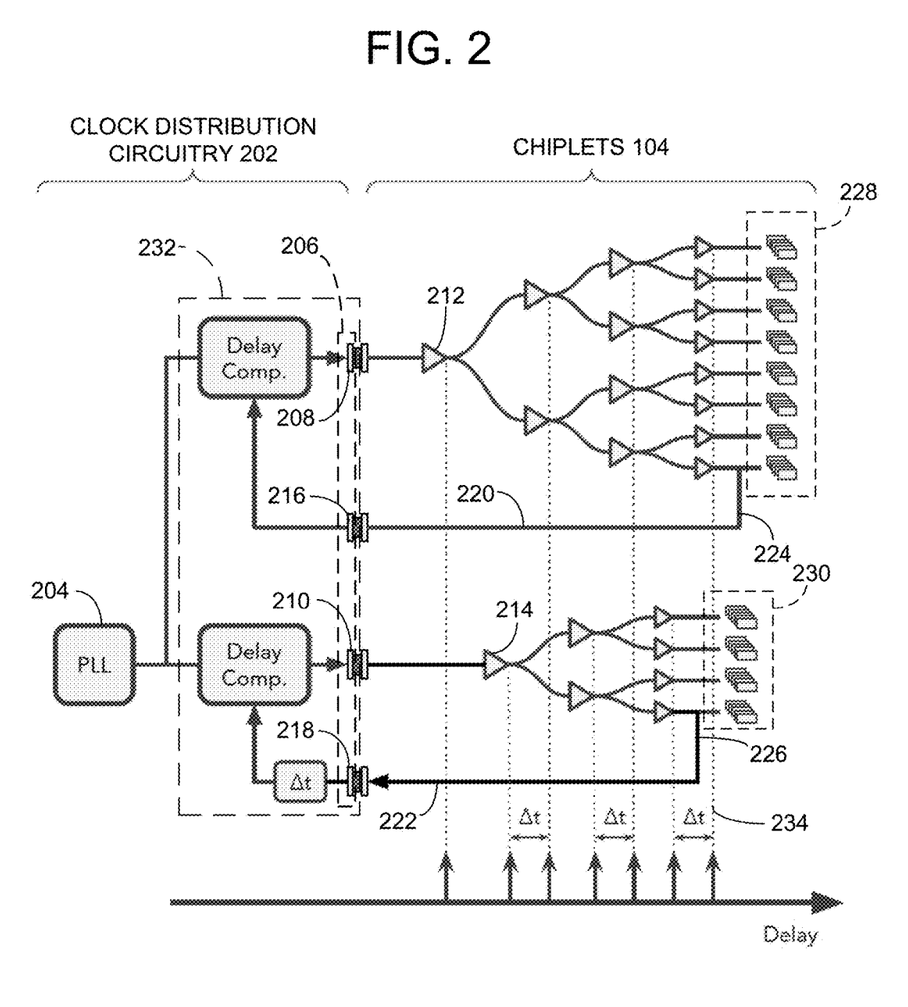
FIG. 2 illustrates one embodiment of the clock distribution circuitry of the FPPA of FIG. 1.

FIG. 2 illustrates one embodiment of clock distribution circuitry 202 employed by the FPPA 112. The clock distribution circuitry 202 includes a clock generator 204, such as a phase-locked loop (PLL), to receive a stable clock of a given frequency from the crystal clock source 122 (FIG. 1), and to produce a frequency-multiplied version of the crystal clock signal. A clock interface 206 formed in the FPPA includes multiple transmit pins or contact pads 208 and 210 for connecting to corresponding clock tree source nodes 212 and 214 disposed external to the FPPA and associated with one or more of the logic device chiplets 104 or the memory devices 106. The clock interface 206 additionally includes multiple receiver pins or contact pads 216 and 218 for connecting to corresponding feedback paths 220 and 222 that deliver versions of arrival clock signals, such as from 224 and 226 that are tapped from one or more sets of clocked devices 228 and 230 associated with respective clock trees fed by the clock tree source nodes 212 and 214.

Further referring to FIG. 2, for one embodiment, to ensure that the respective first and second sets of clocked devices 228 and 230 receive respective versions of the source clock signal at an aligned arrival time, delay compensation circuitry 232 is provided to pairs of the transmit/receive pads, such as 208, 216 and 210, 218 of the clock interface 206. Generally, the delay compensation circuitry 232 counteracts or compensates for a variety of design and silicon-related effects, such as the depth of the respective chiplet clock trees, or process, voltage or temperature (PVT) characteristics that may affect the respective chiplets and/or memory devices differently. The delay compensation circuitry 232 enables the respective chiplets and memory devices to synchronize with each other without use of complex and power hungry clock domain crossing (CDC) circuits. One embodiment of phase compensation circuitry suitable for the FPPA is described in U.S. patent application Ser. No. 17/552,318, entitled "Digital System Synchronization", filed Dec. 15, 2021, assigned to the assignee of the present disclosure, and expressly incorporated herein by reference.

Further referring to FIG. 2, by separately delaying the two source clock signals at the transmit pads 208 and 210 based on separate phase differences involving, for example, a common reference clock signal and "arrived" versions of the separate source clock signals, the relative phases of the two arrived versions of the source clock signal become aligned, at 234, representing the timing boundary where the separate sets of clocked devices 228 and 230 receive their respective clock signals, and thus can communicate in a synchronous fashion.

Figure 3:
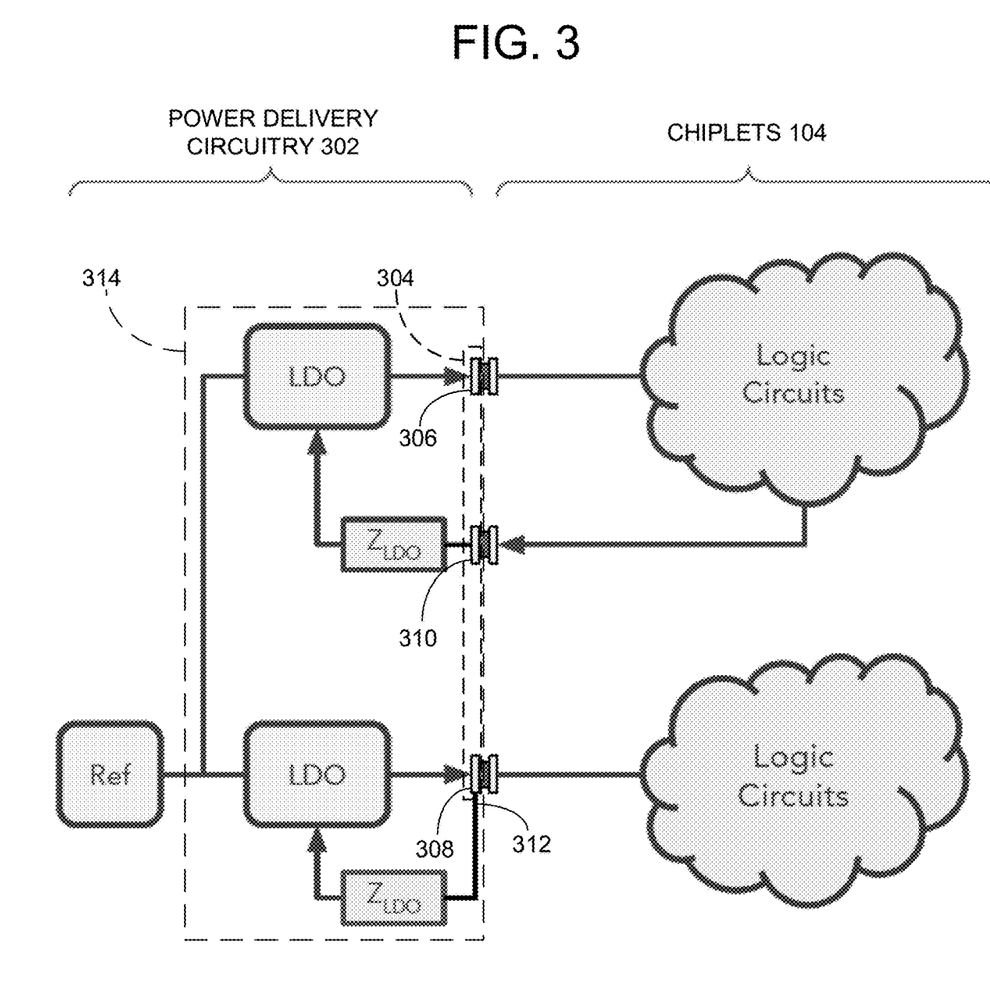
FIG. 3 illustrates one embodiment of the power distribution circuitry of the FPPA of FIG. 1.

FIG. 3 illustrates power delivery circuitry 302 that may be employed in the FPPA 112 of FIG. 1. The power delivery circuitry 302 includes a power interface 304 that includes one or more power delivery contact pads, such as at 306 and 308, and one or more load detection pads 310 to detect load voltages at an external voltage node of one or more of the chiplets or memory devices. For one embodiment, load regulation may be constrained to the power interface itself, where the delivered power is tapped at 312 for regulation purposes.

Further referring to FIG. 3, for one embodiment, the power delivery circuitry 302 includes power regulation circuitry 314 configured to align off-chip power characteristics, such as on-chiplet or on-memory voltage sources to various desired relationships. For one embodiment, as shown in FIG. 3, the regulation capabilities of the power regulation circuitry 314 aligns the internal voltage of one chiplet with the interface voltage of another chiplet. Having programmable circuitry residing in the FPPA enhances the flexibility for a user to define and configure various power delivery alignments in ways that maximize performance and/or minimize power consumption.

FIG. 4 illustrates one embodiment of a 2.5D semiconductor package 402 where multiple logic die 404 and 406 are assembled with an FPPA die 408. In general, 2.5D packaging refers to the stacking of IC chips that communicate via an intermediate routing device such as an interposer. For one embodiment, the multiple logic die 404 and 406 interface with the FPPA 408 in a face-to-face vertically stacked configuration via conductive paths (not shown) formed in a common or shared RDL 410 that is interposed between the FPPA 408 and the multiple logic die 404 and 406 to form an interposer structure. The common RDL 410 may then communicate with a package RDL 412 using, for example, copper vias 414. For some embodiments, the common RDL 410 connects to the package RDL 412 using one or more through-silicon vias (TSV) (not shown), a backside RDL (not shown), and/or one or more controlled collapse chip connections (C4) (not shown). The semiconductor package 402 may then be mounted to a second package, such as a PCB 416, to form a package-on-package assembly 418.

In a further embodiment, shown in FIG. 5, one embodiment of a 3D semiconductor package 502 is illustrated. In contrast to 2.5D packaging, 3D packaging generally involves stacking multiple die directly on top of one another and forming through-silicon vias (TSVs) in the multiple die. In one embodiment, the 3D semiconductor package 502 includes a logic die 504 vertically stacked with and mounted to an FPPA die 506. In some embodiments, the stacked die 504 and 506 may be mounted to a first RDL 508, which is thereupon soldered to a PCB 510.

FIG. 6 illustrates a cross-sectional view corresponding to detail 6-6 of FIG. 5, and shows further structural detail relating to the face-to-face bonded logic die 504 and FPPA die 506. The logic die 504 is shown as having a first silicon substrate 602 having logic device circuitry formed thereon, at 604. Various metal layers form a logic metal stack, at 606, that form connective paths, such as at 608, to connect a logic device to a bonding pad, at 610.

Further referring to FIG. 6, the FPPA die 506 is shown as having a second silicon substrate 612 having FPPA device circuitry formed thereon, at 614. Various FPPA metal layers form an FPPA metal stack, at 616, that form connective paths, such as at 618, to cooperate with through-silicon-vias (TSVs), such as at 620, that connect a portion of the logic device circuitry 604 to a package bonding pad, at 622 that is formed in a backside RDL that engages C4 connections, at 624.

Figure 7:
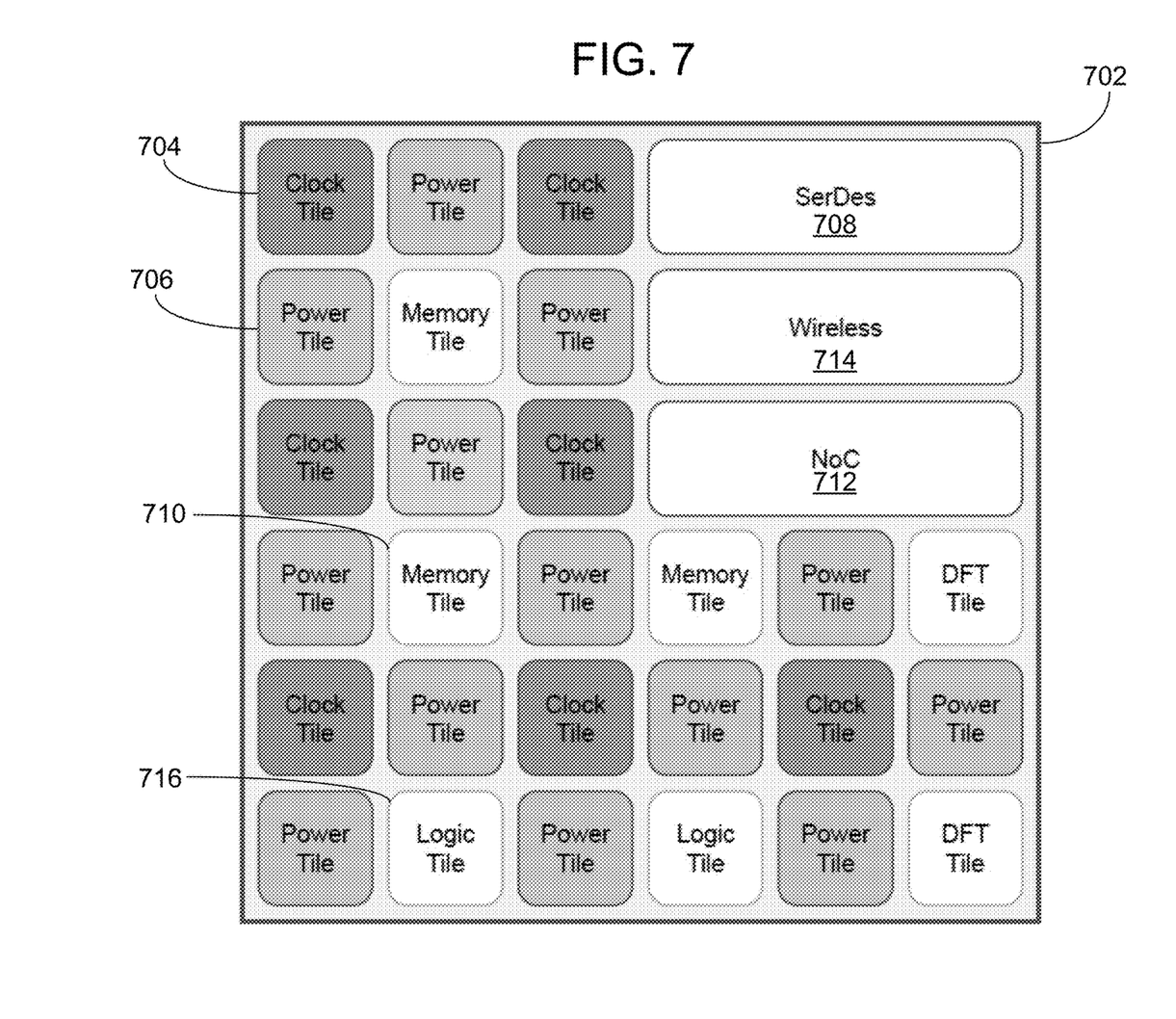
FIG. 7 illustrates a further embodiment of the FPPA of FIG. 1.

FIG. 7 illustrates one embodiment of the FPPA of FIG. 1, generally designated 702, using various programmable and reconfigurable subsystems such as clock generation circuitry 704, power delivery circuitry 706, high-speed interface circuitry such as serializer/deserializer (SerDes) circuitry 708, memory circuitry 710, network-on-chip (NoC) circuitry 712, wireless circuitry 714 and programmable logic circuitry 716, to name but a few. Although each subsystem generally provides for programmable functionality, the physical location for each subsystem would remain fixed upon construction.

Those skilled in the art will appreciate that the architecture described above enables the synchronization of separately partitioned digital subsystems to be efficiently synchronized without the need for complex and power hungry clock domain crossing circuitry. Additionally, using the FPPA to deliver power to each of the chiplets enables a higher quality power distribution profile. Local regulators within the FPPA can manage the power delivery to each of the chiplets, and local clock generators within the FPPA can manage the clock delivery to chiplets.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit (IC) chip, comprising:
   clock generation circuitry to generate a clock signal;
   clock interface circuitry coupled to the clock generation circuitry and including
      multiple transmit pads distributed across a mounting surface of the IC chip, each of the multiple transmit pads to transmit a respective version of the clock signal to one or more clocked devices that are disposed on a second IC chip, each transmitted version of the clock signal arriving at a clock input of the one or more clocked devices as an arrival clock signal;
      multiple receiver pads distributed across the mounting surface of the IC chip and corresponding to the multiple transmit pads, each of the multiple receiver pads to receive a version of a corresponding arrival clock signal that is fed back along a feedback path from the one or more clocked devices that are disposed on the second IC chip; and
   delay compensation circuitry coupled to the clock interface circuitry and including
      multiple delay circuits corresponding to the multiple transmit pads, each of the multiple delay circuits configured to delay a version of the clock signal fed to a corresponding transmit pad by a separate delay value, in response to the corresponding arrival clock signal, to establish global timing alignment of each arrival clock signal at the one or more clocked devices;
   power generation circuitry to generate a reference voltage;
   voltage interface circuitry including
      multiple voltage source pads distributed across the mounting surface of the IC chip, each of the multiple v age source pads to deliver a regulated version of the reference voltage to the one or more of the clocked devices;
      multiple voltage monitoring pads distributed across the mounting surface of the IC chip and corresponding to the multiple voltage source pads, each of the multiple voltage monitoring pads to receive respective load voltages from the one or more of the clocked devices; and
   voltage compensation circuitry coupled to the voltage interface circuitry and including
      multiple regulation circuits, each of the multiple regulation circuits configured to adjust a version of the reference voltage fed to a voltage source pin by a separate adjustment value to establish global magnitude alignment of the load voltages at the one or more of the clocked devices.

2. The IC chip of claim 1, wherein:
each separate delay value is based on a phase difference between an arrival clock signal that is received on an individual one of the multiple receiver pads and a global timing reference signal.

3. The IC chip of claim 2, wherein:
each separate delay value associated with each delay circuit of the multiple delay circuits is free to be different.

4. The IC chip of claim 1, wherein:
each separate adjustment value is based on a voltage difference between a given load voltage and the reference voltage.

5. The IC chip of claim 1, further comprising:
programmable logic to configure the delay compensation circuitry.

6. The IC chip of claim 1, wherein the clock interface circuitry is configured for packaging with the second IC chip in a face-to-face arrangement.

7. A semiconductor package, comprising:
a first integrated circuit (IC) chip including multiple clocked devices; and
a second IC chip packaged with the first IC chip, the second IC chip including
clock generation circuitry to generate a clock signal;
clock interface circuitry including
multiple transmit pins distributed across a mounting surface of the second IC chip, each of the multiple transmit pins to transmit a respective version of the clock signal to the multiple clocked devices, each transmitted version of the clock signal arriving at a clock input of at least one of the multiple clocked devices as an arrival clock signal;
multiple receiver pins distributed across the mounting surface of the second IC chip and corresponding to the multiple transmit pins, each of the multiple receiver pins to receive a version of a corresponding arrival clock signal that is fed back along a feedback path from the multiple clocked devices of the first IC chip;
delay compensation circuitry coupled to the clock interface circuitry and including
multiple delay circuits corresponding to the multiple transmit pins, each of the multiple delay circuits configured to adaptively delay a version of the clock signal fed to a corresponding transmit pin by a separate delay value, in response to the corresponding arrival clock signal, to establish global timing alignment of each arrival clock signal at the multiple clocked devices;
power generation circuitry to generate a reference voltage;
voltage interface circuitry including
multiple voltage source pads distributed across the mounting surface of the second IC chip, each of the multiple voltage source pins to deliver a regulated version of the reference voltage to the multiple clocked device of the first IC chip;
multiple voltage monitoring pins distributed across the mounting surface of the IC chip and corresponding to the multiple voltage source pins, each of the multiple voltage monitoring pins to receive respective load voltages from the multiple clocked devices of the first IC chip; and
voltage compensation circuitry coupled to the voltage interface circuitry and including
multiple regulation circuits, each of the multiple regulation circuits configured to adjust a version of the reference voltage fed to a voltage source pin by a separate adjustment value to establish global magnitude alignment of the load voltages at the multiple clocked device of the first IC chip.

8. The semiconductor package of claim 7, wherein:
each separate delay value is based on a phase difference between an arrival clock signal and a global timing reference signal.

9. The semiconductor package of claim 8, wherein:
each separate delay value is free to be different.

10. The semiconductor package of claim 7, wherein:
the second IC chip is stacked in a face-to-face arrangement with the first IC chip.

11. The semiconductor package of claim 10, further comprising:
an interposer disposed between the first IC chip and the second IC chip to form a 2.5D package, the interposer to route signals and power between the first IC chip and the second IC chip.

12. The semiconductor package of claim 10, wherein:
the first IC chip and the second IC chip are directly bonded together to form a 3D package, and wherein one or both of the first IC chip and the second IC chip are formed with through-silicon vias (TSVs) to route signals and power between the first IC chip and the second IC chip.

* * * * *